United States Patent
Paul et al.

(10) Patent No.: US 10,168,406 B2
(45) Date of Patent: Jan. 1, 2019

(54) METHOD AND DEVICE FOR OPTIMIZING A MAGNETIC RESONANCE SEQUENCE

(71) Applicant: Siemens Aktiengesellschaft, Munich (DE)

(72) Inventors: Dominik Paul, Bubenreuth (DE); Joerg Roland, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 642 days.

(21) Appl. No.: 14/685,942

(22) Filed: Apr. 14, 2015

(65) Prior Publication Data
US 2015/0293190 A1 Oct. 15, 2015

(30) Foreign Application Priority Data
Apr. 14, 2014 (DE) .................. 10 2014 207 100

(51) Int. Cl.
| | |
|---|---|
| *G01V 3/00* | (2006.01) |
| *G01R 33/54* | (2006.01) |
| *G01R 33/48* | (2006.01) |
| *G01R 33/483* | (2006.01) |
| *G01R 33/385* | (2006.01) |

(52) U.S. Cl.
CPC ......... *G01R 33/543* (2013.01); *G01R 33/482* (2013.01); *G01R 33/4816* (2013.01); *G01R 33/4818* (2013.01); *G01R 33/4822* (2013.01); *G01R 33/4824* (2013.01); *G01R 33/4826* (2013.01); *G01R 33/4828* (2013.01);
(Continued)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/4836; G01R 33/4838
USPC .................................................. 324/300–322
See application file for complete search history.

(56) References Cited

U.S. PATENT DOCUMENTS 6,452,391 B1 9/2002 Bernstein et al.
2003/0191386 A1* 10/2003 Heid ................. G01R 33/54
600/410

(Continued)

*Primary Examiner* — Giovanni Astacio-Oquendo
*Assistant Examiner* — Raul Rios Russo
(74) *Attorney, Agent, or Firm* — Schiff Hardin LLP (57) ABSTRACT

In order to provide an effective optimization of a magnetic resonance sequence, particularly with regard to optimizing the slew rates of gradient switching sequences of the magnetic resonance sequence, in a method for optimizing a magnetic resonance sequence of a magnetic resonance apparatus, wherein the magnetic resonance sequence includes multiple pre-set gradient switching sequences with multiple pre-set slew rates, the multiple pre-set slew rates are provided to a computer wherein the multiple pre-set slew rates are evaluated. At least one optimization measure for the magnetic resonance sequence is defined based on the evaluation of the multiple pre-set slew rates. The magnetic resonance sequence is optimized based on the at least one pre-set optimization measure, wherein the optimized magnetic resonance sequence has multiple optimized gradient switching sequences with multiple optimized slew rates, and the multiple optimized slew rates being optimized in relation to the multiple pre-set slew rates.

11 Claims, 2 Drawing Sheets

(52) U.S. Cl.
CPC ........ *G01R 33/3854* (2013.01); *G01R 33/483* (2013.01); *G01R 33/4831* (2013.01)

(56) References Cited

U.S. PATENT DOCUMENTS

| | | | |
|---|---|---|---|
| 2004/0075434 A1* | 4/2004 | Vavrek | G01R 33/385 324/318 |
| 2008/0024129 A1* | 1/2008 | Heid | G01R 33/54 324/307 |
| 2013/0200893 A1 | 8/2013 | Heismann et al. | |
| 2013/0249549 A1* | 9/2013 | Pfeuffer | G01R 33/4833 324/309 |
| 2014/0232396 A1* | 8/2014 | Grodzki | G01R 33/543 324/309 |
| 2014/0347050 A1* | 11/2014 | Gui | G01R 33/4824 324/309 |
| 2015/0160317 A1* | 6/2015 | Grodzki | G01R 33/543 702/57 |
| 2015/0253408 A1* | 9/2015 | Grodzki | G01R 33/307 324/309 |
| 2015/0285881 A1* | 10/2015 | Ott | G01R 33/30 324/309 |

* cited by examiner

METHOD AND DEVICE FOR OPTIMIZING A MAGNETIC RESONANCE SEQUENCE

BACKGROUND OF THE INVENTION

Field of the Invention

The invention relates to a method for optimizing a magnetic resonance sequence for operating a magnetic resonance apparatus, a method for operating a magnetic resonance apparatus, a sequence optimizing device, a magnetic resonance apparatus and a storage medium encoded with programming instructions that cause a computer to implement such a method.

Description of the Prior Art

In a magnetic resonance apparatus, also known as a magnetic resonance tomography system, the body of the subject to be examined, particularly that of a patient, is typically exposed to a relatively strong magnetic field of, for example, 1.5 or 3 or 7 Tesla, with the use of a basic field magnet of a scanner in which the subject is situated. In addition, gradient switching sequences are activated by a gradient coil arrangement of the scanner. By operation of a radio frequency antenna in the scanner, using suitable antenna devices, radio frequency pulses, particularly excitation pulses, are radiated, which cause nuclear spins of particular atoms excited into resonance by these radio frequency pulses to be tilted through a defined flip angle relative to the magnetic field lines of the basic magnetic field. Upon relaxation of the nuclear spin, radio frequency signals known as magnetic resonance signals are emitted and are received by suitable radio frequency antennae, and are then further processed. From the raw data thereby acquired, the desired image data can ultimately be reconstructed.

For a particular scan, therefore, the scanner is operated according to a specific magnetic resonance sequence, also known as a "pulse sequence," formed as a sequence of radio frequency pulses, in particular excitation pulses and refocusing pulses, as well as gradient switching sequences to be activated, coordinated in time with the radio frequency pulses, on various gradient axes along different spatial directions. Temporally adapted thereto, readout windows are set that specify the time frames within which the induced magnetic resonance signals are detected.

The gradient switching sequences specified by the magnetic resonance sequence can lead to the magnetic resonance scanner having a high level of loudness during the acquisition of the magnetic resonance data.

SUMMARY OF THE INVENTION

An object of the invention is to provide effective optimization of a magnetic resonance sequence, particularly with regard to optimizing of the slew rates of gradient switching sequences of the magnetic resonance sequence.

The basis of the invention is a method for optimizing a magnetic resonance sequence of a magnetic resonance device wherein the magnetic resonance sequence includes multiple pre-set gradient switching sequences respectively with pre-set slew rates. In accordance with the invention, the multiple pre-set slew rates are identified from an input to a processor and the pre-set slew rates are evaluated in the processor in order to define at least one optimizing measure for the magnetic resonance sequence based on the evaluation of the plurality of pre-set slew rates. The magnetic resonance sequence is then optimized based on the at least one pre-set optimizing measure, so the optimized magnetic resonance sequence has multiple optimized gradient switching sequences respectively with multiple optimized slew rates, and the multiple optimized slew rates are optimized with respect to the multiple pre-set slew rates.

A complete, or transmission-ready but in the method according to the invention, still optimizable, magnetic resonance sequence is supplied to the processor as the aforementioned input. This magnetic resonance sequence typically has a number, (one or more) of radio frequency pulses, for example, at least one excitation and/or refocusing pulse, and a number of gradient switching sequences temporally coordinated therewith.

The gradient switching sequences have slew rates. A slew rate is typically defined as the edge steepness of the gradient switching sequence. A slew rate is, in particular, the first derivative of the gradient shape dG/dt of the gradient switching sequences. The pre-set gradient switching sequences of the non-optimized magnetic resonance sequence have non-optimized pre-set slew rates. The pre-set gradient switching sequences are implemented as standard gradient switching sequences in the magnetic resonance sequence. The pre-set gradient switching sequences can be pre-set, for example, by the sequence protocol of the non-optimized magnetic resonance sequence. The optimized gradient switching sequences of the optimized magnetic resonance sequence have optimized slew rates. In particular, each of the multiple pre-set gradient switching sequences has one pre-set slew rate of the multiple pre-set slew rates. In particular, each of the plurality of optimized gradient switching sequences has one pre-set slew rate of the plurality of pre-set slew rates. The optimized gradient switching sequences of the optimized magnetic resonance sequence originate herein, in particular, from the pre-set gradient switching sequences.

A gradient switching sequence can be composed of multiple gradient pulses. Thus, a number of gradient pulses can be grouped together into a gradient switching sequence. For example, a fat saturation element of the magnetic resonance sequence can have a number of gradient pulses that can then be grouped together to form a fat saturation gradient switching sequence. The slew rate of the gradient switching sequence can then be taken as the slew rate of the gradient pulse of the gradient switching sequence with the highest slew rate.

The identification of the multiple pre-set slew rates can mean that the multiple pre-set slew rates of the pre-set gradient switching sequences can be derived from the sequence provided as the input to the processor, in particular, automatically. In particular, the values of the multiple pre-set slew rates can be derived in the unit mT/(m*ms). The values of the multiple pre-set slew rates can also be derived in arbitrarily scaled units. The pre-set gradient switching sequences can be listed together with the pre-set slew rates. Advantageously, thereafter, the multiple pre-set slew rates of the pre-set gradient switching sequences can be evaluated. The evaluation can take place using different evaluation conditions, for example, a comparison of the size of the multiple pre-set slew rates.

Based on the multiple pre-set slew rates that are identified and evaluated, a computer system and/or a user can derive at least one optimizing measure for optimizing the multiple pre-set gradient switching sequences. For the evaluation of the multiple pre-set slew rates, the multiple pre-set slew rates are preferably not treated individually, but a number of pre-set slew rates are evaluated in combination. If, for example, it is determined that a large deviation exists in the values of the multiple pre-set slew rates, then for optimization of the multiple pre-set gradient switching sequences, a subset of the multiple pre-set slew rates is reduced and another subset of the multiple pre-set slew rates is increased, so that the multiple optimized slew rates have values that are matched to one another. The optimizing of the multiple pre-set slew rates can also be carried out iteratively.

The optimization of the magnetic resonance sequence can also be subjected to additional limit conditions. For example, information concerning a known effect of a change of a gradient switching sequence and/or information concerning relationships between gradient switching sequences and/or information relating to a change in an image quality based on an adjustment of a gradient switching sequence can be taken into account during the optimizing of the magnetic resonance sequence.

The multiple optimized slew rates are optimized with respect to the multiple pre-set slew rates such that at least one optimized slew rate of the multiple optimized slew rates is reduced relative to the corresponding pre-set slew rate of the multiple pre-set slew rates. An objective of the optimization of the gradient switching sequences thus can be the presence of the lowest possible optimized slew rates.

Thus, the optimization of the magnetic resonance sequence is directed toward acoustic noise optimization, particularly acoustic noise reduction in the magnetic resonance sequence. During a magnetic resonance sequence, the magnetic gradient coils, by means of which the gradient switching sequences are emitted, are frequently and rapidly switched. Since the time pre-selections within a magnetic resonance sequence are mostly very strict and also the overall duration of a magnetic resonance sequence, which determines the overall duration of a magnetic resonance examination, must be kept as short as possible, gradient amplitudes of approximately 40 mT/m and slew rates of up to 200 mT/m/ms must sometimes be achieved. Such a high edge steepness contributes to the known noise manifestations during switching of the gradient switching sequences. In addition, steep flanks of the gradient switching sequences lead to a higher energy usage and also place greater demands on the gradient coils and other hardware. The rapidly changing gradient fields lead to distortions and oscillations in the gradient switching sequences and to transmission of these energies to the housing of the magnetic resonance device. Moreover, due to the resulting heating of the coils and the other components, a high degree of helium boil-off from the cryogen vessel can occur, if the basic magnetic field is generated by superconducting coils.

The optimization of the optimized slew rates in accordance with the invention achieves particularly good noise reduction. In other words, the optimization of the magnetic resonance sequence preferably takes place with respect to the greatest possible noise reduction by the gradient shape of the gradient switching sequence being optimized with regard to minimizing the first derivative of the function that defines the gradient shape, namely the slew rate. Furthermore, a reduced loading on the gradient system is thereby achieved. Lower power consumption, reduced heating of the gradient coils, and thus reduced helium boil-off are associated with such reduced loading.

In an embodiment, an optimization threshold value is pre-set that at least indirectly defines a slew rate threshold value, and the at least one optimizing measure is set such that the optimization of the magnetic resonance sequence is carried out so that the multiple optimized slew rates are each smaller than the slew rate threshold value, or are equal to the slew rate threshold value. The slew rate threshold value can thus define a maximum slew rate for the multiple optimized slew rates. The optimization slew rate can be pre-set by a user via an input unit (interface) of the computer, or can be specified automatically. The optimization threshold value can be set in relation to any desired variable. The pre-set optimization threshold can be converted, by the use of a calculation rule, into the slew rate threshold. The calculation rule is preferably specific for the magnetic resonance scanner with which the magnetic resonance sequence is to be executed. Such a calculation rule can take into account that, with different types of magnetic resonance scanners, different relationships can exist between the optimization threshold and the slew rate threshold. The specification of the optimization threshold and the transformation of the optimization threshold into a slew rate threshold enable the setting of an optimization threshold that is intuitive for a user. The optimization threshold can also define the slew rate threshold directly. The slew rate threshold thus can be pre-set directly for the optimization.

In another embodiment, the pre-setting of the optimization threshold is pre-setting a loudness threshold for the optimized magnetic resonance sequence. The loudness threshold value can define an upper limit for loudness of the magnetic resonance device during the acquisition of magnetic resonance image data by operation of the scanner according to the optimized magnetic resonance sequence. The loudness of the magnetic resonance scanner during the acquisition of magnetic resonance image data with the optimized magnetic resonance sequence is therefore less than or equal to the loudness threshold. The loudness threshold can be set in decibels. Alternatively or additionally, the loudness threshold can be specified using a scale that can describe different abstract loudness levels, with words such as "loud", "quiet", etc. When the loudness threshold value set is associated with the slew rate threshold, information regarding a relationship between the slew rates and the loudness threshold can be included. The conversion of the loudness threshold into the slew rate threshold can be carried out, for example, using a simulation of the magnetic resonance sequence, in particular with the present configuration of the magnetic resonance scanner. The loudness threshold is a particularly intuitive threshold. The loudness threshold also enables an increase in patient safety during the magnetic resonance examination. Furthermore, the loudness threshold can be set such that a patient can be examined with the optimized magnetic resonance sequence without ear protection. Pre-setting the loudness threshold value also offers the advantage that the optimization of the magnetic resonance sequence actually leads to a reduction in the loudness during recording of the optimized magnetic resonance sequence. Thus, a quieter magnetic resonance sequence can be created in a targeted manner.

In another embodiment, the at least one optimizing measure is set so as to cause the optimization of the magnetic resonance sequence to be carried out so that a highest optimized slew rate of the multiple optimized slew rates is reduced relative to a highest pre-set slew rate of the multiple pre-set slew rates. This procedure is based on the recognition that typically the highest slew rate of the plurality of slew rates of the gradient switching sequences of the magnetic resonance sequence defines the loudness during the acquisition of magnetic resonance image data with the magnetic resonance sequence. Thus, if the highest optimized slew rate is reduced relative to the greatest pre-set slew rate, the loudness of the optimized magnetic resonance sequence is advantageously also reduced relative to the loudness of the non-optimized magnetic resonance sequence.

In another embodiment, the magnetic resonance sequence has a number of imaging parameters and the at least one optimizing measure is stipulated such that the optimizing of the magnetic resonance sequence includes an adjustment of at least one imaging parameter among the multiple imaging parameters. This at least one imaging parameter can be varied for optimizing the magnetic resonance sequence. Imaging parameters of the magnetic resonance sequence that can be adjusted in this manner are, inter alia, an echo time, a repetition time, an echo distance, a bandwidth, etc. During optimization of the magnetic resonance sequence, information concerning a relationship between an adjustment of the at least one imaging parameter and a possible optimization, particularly reduction, of the multiple optimized slew rates can be included. Information concerning a relationship between an adjustment of the at least one imaging parameter and an adjustment of the image quality of magnetic resonance image data recorded with the optimized magnetic resonance sequence can also be included. Thus, for example, for an optimization of the slew rates of the magnetic resonance sequence, and thus for a reduction of the loudness during recording of data with the magnetic resonance sequence, a lessening of the image quality of the magnetic resonance image data acquired with the magnetic resonance sequence can possibly be accepted. By an advantageous selection and/or adjustment of the at least one image quality parameter, such a reduction of the image quality can be prevented or reduced. An increase in a measurement time of the magnetic resonance sequence can also be accepted. By the adjustment of the at least one imaging parameter, the magnetic resonance sequence can be optimized particularly flexibly.

In a further embodiment, the at least one optimizing measure is set such that the at least one imaging parameter is adjusted so that the multiple optimized slew rates are each smaller than the slew rate threshold value, or are equal to the slew rate threshold value. The adjustment of the at least one imaging parameter can be done iteratively. The iterations can be executed until the multiple optimized slew rates are smaller than the above-mentioned slew rate threshold value. The adjustment of the at least one imaging parameter can take place such that the slew rate threshold is kept below a lowest possible adjustment in the at least one imaging parameter.

In another embodiment, the at least one imaging parameter is an echo time of the magnetic resonance sequence and the adjustment of the at least one imaging parameter is a prolongation of the echo time. The prolongation of the echo time is advantageous, because it directly enables a lessening in the multiple optimized slew rates.

In another embodiment, the magnetic resonance apparatus has an input unit (interface) via which a threshold value for a maximum adjustment of the at least one imaging parameter is pre-set. The adjustment of the at least one imaging parameter this can be carried out within the pre-settable limits. The adjustment of the at least one imaging parameter can observe limit conditions. A limit condition can be the echo time of the magnetic resonance sequence being permitted to increase by up to a particular percentage value, for example, 20 percent. It can therefore be ensured that the image quality of the image data recorded with the optimized magnetic resonance sequence is maintained as far as possible.

In another embodiment, the magnetic resonance apparatus has an output unit (interface) and an input unit (interface), and a number of optimizations are made based on different optimizing measures, each of which includes different adjustments of the imaging parameters. The results of the number of optimizations are displayed on a display, as the output interface, as a number of optimization suggestions. A selection of at least one optimization suggestion of the plurality of optimization suggestions is carried out via the input unit. If, for example, a number of different adjustments of imaging parameters are possible, then a user can select which adjustment of the imaging parameters should be carried out. Thus, a particularly advantageous optimization of at least one imaging parameter that, for example, does not impair the image quality, can be selected. Thus, in addition to the automatic optimization of the magnetic resonance sequence, the knowledge and experience of a user can be used.

The invention also concerns a method for operating a magnetic resonance apparatus in which, initially with a method according to the invention for optimizing a magnetic resonance sequence, a magnetic resonance sequence is optimized and then the magnetic resonance scanner of the apparatus is operated using the optimized magnetic resonance sequence. The optimization is preferably carried out online during this operation, or directly before the execution of the magnetic resonance sequence.

The invention further concerns a sequence optimizing device for optimizing a magnetic resonance sequence of a magnetic resonance device. The sequence optimizing unit has a computer configured to implement the method according to the invention. The sequence optimizing device is therefore configured to execute a method for optimizing a magnetic resonance sequence of a magnetic resonance device.

The magnetic resonance sequence includes a number of pre-set gradient switching sequences with a number of pre-set slew rates. The sequence optimizing device has an acquisition unit configured to acquire (receive) the multiple pre-set slew rates. The sequence optimizing device also has an optimizing processor that is configured to evaluate the multiple pre-set slew rates, based on the evaluation of the multiple pre-set slew rates, to stipulate at least one optimizing measure for the magnetic resonance sequence and to optimize the magnetic resonance sequence based on the at least one specified optimization measure, wherein the optimized magnetic resonance sequence has multiple optimized gradient switching sequences with multiple optimized slew rates, and the multiple optimized slew rates are optimized in relation to the multiple pre-set slew rates.

Embodiments of the sequence optimizing device according to the invention are configured similarly to the embodiments of the method according to the invention. The sequence optimizing device can have further control components which are necessary and/or advantageous for carrying out a method according to the invention. The sequence optimizing device can also be configured to transmit control signals to a magnetic resonance apparatus or scanner and/or to receive and/or process control signals in order to carry out a method according to the invention. Preferably, the sequence optimizing device is part of the control computer of the magnetic resonance apparatus and is preferably connected relatively closely upstream of the radio frequency antenna unit and/or the gradient coil unit. In a storage unit of the sequence optimizing device, computer programs and other software can be stored, with which the processor of the sequence optimizing device automatically controls and/or carries out the method according to the invention.

A magnetic resonance apparatus according to the invention has such a sequence optimizing device. The magnetic resonance apparatus according to the invention is thus configured to execute the method according to the invention with this sequence optimizing device. The sequence optimizing device can be integrated into the magnetic resonance apparatus. The sequence optimizing unit can also be installed separately from the magnetic resonance apparatus and connected to the magnetic resonance apparatus, such as via a link with the control computer thereof.

A non-transitory, computer-readable data storage medium according to the invention is directly loadable into a memory of a programmable computer of a magnetic resonance apparatus, and is encoded with programming instructions (code) in order to cause the computer to carry out the method according to the invention when the instructions are executed in the computer. In this way, the method according to the invention can be carried out rapidly, exactly reproducibly and robustly. The computer must have the preconditions such as, for example, a suitable working memory, a suitable graphics card, or a suitable logic unit so that the respective method steps can be carried out efficiently.

Examples of electronically readable data storage media are a DVD, a magnetic tape or a USB stick, on which electronically readable control information, in particular software, is stored.

The advantages of the method for operating a magnetic resonance apparatus, the sequence optimizing device according to the invention, the magnetic resonance apparatus according to the invention and the data storage medium according to the invention substantially correspond to the advantages of the method according to the invention for optimizing a magnetic resonance sequence, which are described in detail above. The corresponding functional features of the method are configured as suitable modules, such as hardware modules.

DESCRIPTION OF THE PREFERRED EMBODIMENTS

Figure 1:
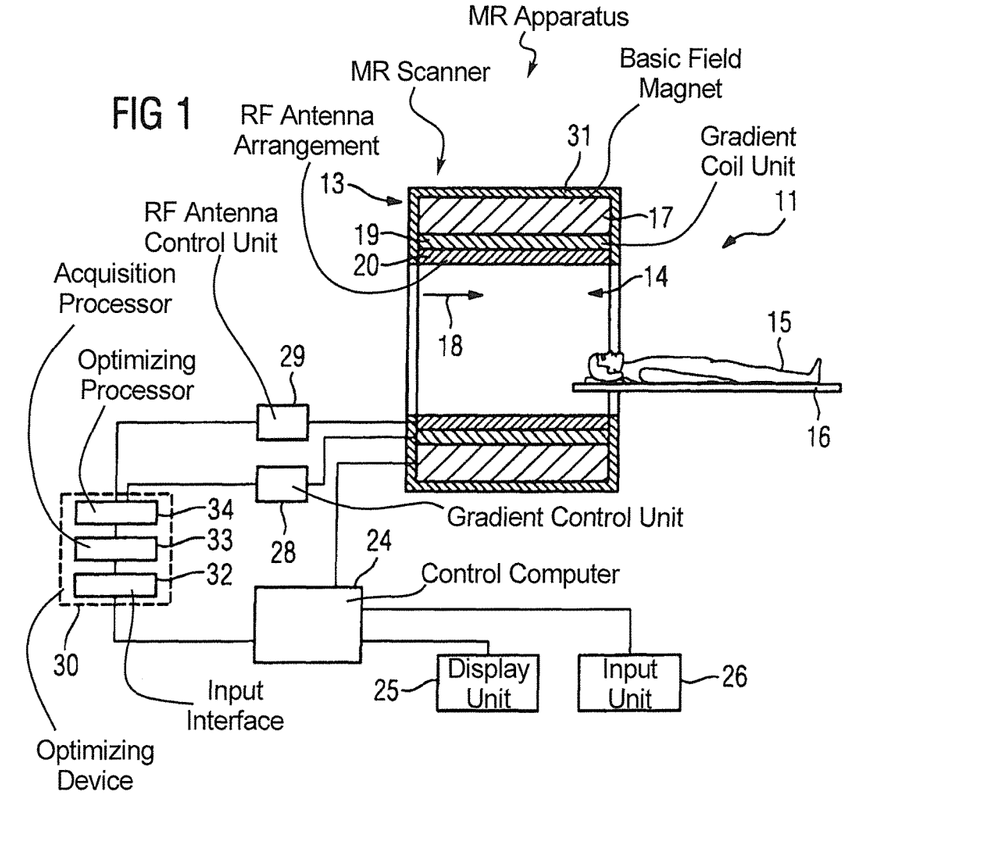
FIG. 1 shows a magnetic resonance apparatus according to the invention for implementing the method according to the invention, in a schematic illustration.

FIG. 1 shows a magnetic resonance (MR) apparatus 11 according to the invention for implementing the method according to the invention, in a schematic representation. The magnetic resonance apparatus 11 has a scanner 13 with a basic field magnet 17 for generating a strong, constant, basic magnetic field 18. The magnetic resonance scanner 13 has a cylindrical patient receiving region 14 for accommodating a patient 15, wherein the patient receiving region 14 is cylindrically enclosed peripherally by the scanner 13. The patient 15 can be moved by a patient support 16 of the magnetic resonance device 11 into the patient receiving region 14. For this purpose, the patient support 16 has a patient table that is movable within the magnetic resonance scanner 13. The scanner 13 is shielded toward the exterior by a housing covering 31 of the magnetic resonance device.

The scanner 13 also has a gradient coil unit 19 for generating magnetic field gradients that are used for spatial (location) encoding during imaging. The gradient coil unit 19 is controlled by a gradient control unit 28. Furthermore, the scanner 13 has a radio frequency (RF) antenna arrangement 20 that, in the case shown is configured as a body coil integrated into the magnetic resonance device 10, and a radio frequency antenna control unit 29 that operates (in this case) the RF antenna arrangement 20 so as to give nuclear spins of particular atoms (nuclei) in the patient or magnetization that deflects the spins by a flip angle relative to the polarization thereof that is created by the main magnetic field 18 generated by the main magnet 17. The radio frequency antenna arrangement 20 is controlled by the radio frequency antenna control unit 29 so as to radiate radio frequency pulses into an examination volume formed within the patient receiving region 14.

For controlling the basic field magnet 17, the gradient control unit 28 and the radio frequency antenna control unit 29, the magnetic resonance apparatus 11 has a control computer 24. The control computer 24 controls the magnetic resonance scanner 13, for example, to execute magnetic resonance sequences, centrally. Control information such as, for example, imaging parameters and reconstructed magnetic resonance images can be displayed for a user on a display unit 25, for example on at least one monitor of the magnetic resonance device 11. In addition, the magnetic resonance apparatus 11 has an input unit (interface) 26 via which information and/or imaging parameters can be entered by a user during a scanning procedure. The control computer 24 can include the gradient control unit 28 and/or the radio frequency antenna control unit 29 and/or the display unit 25 and/or the input unit 26.

The magnetic resonance apparatus 11 also has a sequence optimizing device 30 that has a computer for optimizing magnetic resonance sequences. For this purpose, the computer of the sequence optimizing device 30 has an input interface 32, an acquisition processor 33 and an optimizing processor 34. The magnetic resonance apparatus 11, in particular the sequence optimizing device 30, is configured for carrying out the method according to the invention.

The magnetic resonance apparatus 11 can naturally have further components that magnetic resonance apparatuses typically have. The general functioning of a magnetic resonance apparatus is known to those skilled in the art, so that a detailed description of the further components need not be included herein.

Figure 2:
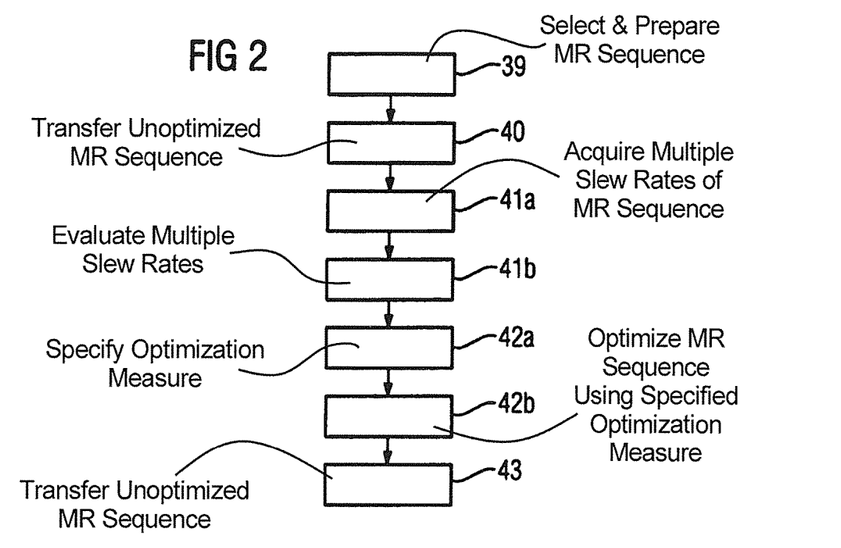
FIG. 2 is a flowchart of a first embodiment of the method according to the invention.

FIG. 2 is a flowchart of a first embodiment of the method according to the invention. In the embodiments shown in FIGS. 2 and 3, the optimization of the magnetic resonance sequence takes place largely automatically. Alternatively, it is also possible for method steps which take place automatically in the embodiments of FIGS. 2 and 3, to be carried out manually and vice versa.

In a first method step 39, initially a selection and preparation of a magnetic resonance sequence of the magnetic resonance device 11 is carried out in the usual way. This means that typically a user stipulates, via the input unit 26, the type of magnetic resonance sequence and/or seeks a suitable protocol in which a particular magnetic resonance sequence is defined. The protocols contain various imaging parameters for the respective magnetic resonance sequence. These imaging parameters include particular basic data for the desired magnetic resonance sequence, for example, the type of magnetic resonance sequence, that is, whether it is a spin echo sequence, a turbo spin echo sequence, etc. Furthermore, the imaging parameters include slice thicknesses, slice spacings, number of the slices, resolution, repetition times, the echo times in a spin echo sequence, etc. With the use of the input unit 26, the user can adjust part of these imaging parameters in order to generate an individual magnetic resonance sequence for a currently desired scan. For this purpose, adjustable imaging parameters are offered to the user, for example, on a graphical user interface of the display unit 25 for modification. The prepared magnetic resonance sequence has multiple pre-set gradient switching sequences with multiple pre-set slew rates.

In a further method step 40, the transfer of the magnetic resonance sequence which is ready to send, but not yet optimized, takes place. The magnetic resonance sequence is not directly transferred to the gradient control unit 28 and the radio frequency antenna control unit 29. Rather, in the further method step 202, the magnetic resonance sequence is transferred via the computer 24, before being transferred to the gradient control unit 28 and the radio frequency antenna control unit 29, to the sequence optimizing device 30 for optimizing the magnetic resonance sequence. In this regard, the input interface 32 of the sequence optimizing device 30 is configured to accept the magnetic resonance sequence that is actually transmission-ready, but is to be optimized.

In a further method step 41a, the acquisition unit 33 of the sequence optimizing unit 30 acquires the multiple pre-set slew rates of the magnetic resonance sequence. For example, for this purpose, the acquisition unit 33 can analyze the multiple pre-set gradient switching sequences of the magnetic resonance sequence and can read out the multiple pre-set slew rates of the multiple pre-set gradient switching sequences. In a further method step 41b, the optimizing unit 34 of the sequence optimizing unit 30 evaluates the multiple pre-set slew rates. For this purpose, firstly, the pre-set slew rates acquired by the acquisition unit 33 can be transferred to the optimizing unit 34.

In a further method step 42a, the optimizing unit 34 specifies at least one optimizing measure for the magnetic resonance sequence based on the evaluation of the multiple pre-set slew rates.

In a further method step 42b, the optimizing unit 34 of the sequence optimizing device 30 optimizes the magnetic resonance sequence based on the at least one optimizing measure stipulated in the further method step 42a. The optimizing device 34 optimizes the magnetic resonance sequence such that an optimized magnetic resonance sequence is generated, wherein the optimized magnetic resonance sequence comprises a plurality of optimized gradient switching sequences with a plurality of optimized slew rates and the multiple optimized slew rates is optimized in relation to the multiple pre-set slew rates.

In a further method step 43, the optimized magnetic resonance sequence is finally transferred by the sequence optimizing device 30 to the gradient control unit 28 and the radio frequency antenna control unit 29. The gradient control unit 28 and the radio frequency antenna control unit 29 generate the relevant control commands from the optimized magnetic resonance sequence and provide these to the radio frequency antenna arrangement 20 and the gradient coil unit 19, so that the overall optimized magnetic resonance sequence is executed with, for example, a reduced loudness as compared to before the optimization, in order to acquire magnetic resonance data by operation of the magnetic resonance scanner 13.

Figure 3:
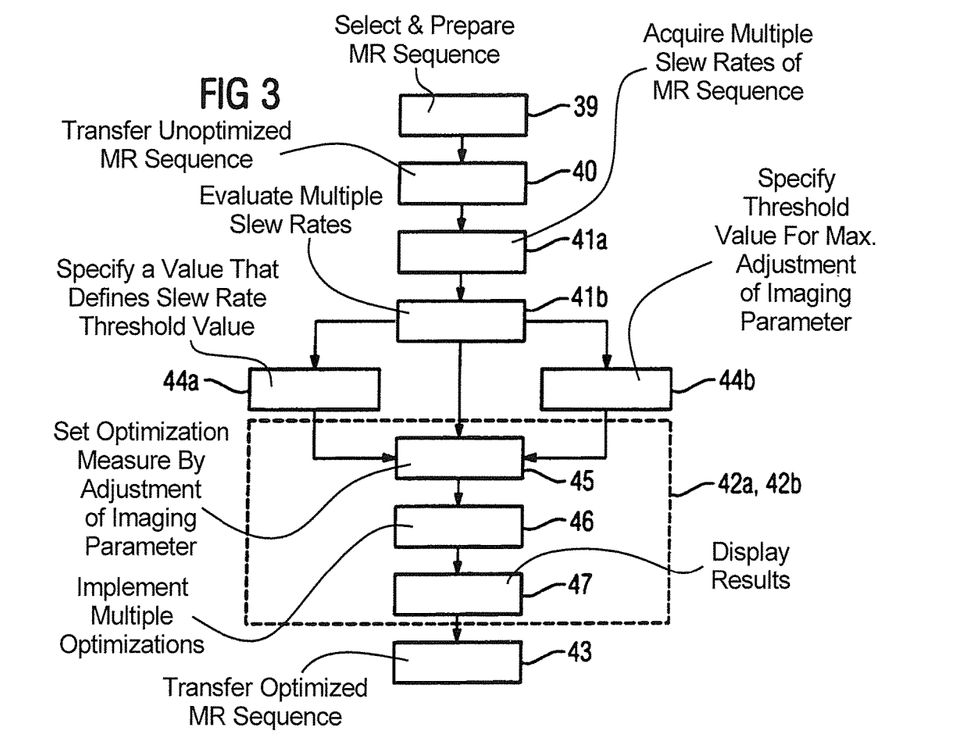
FIG. 3 is a flowchart of a second embodiment of the method according to the invention.

FIG. 3 shows a flowchart of a second embodiment of the method according to the invention.

The following description is essentially restricted to the differences from the exemplary embodiment in FIG. 2 wherein, with regard to method steps which remain the same, reference can be made to the description of the exemplary embodiment in FIG. 2. In principle, the same method steps are essentially identified with the same reference signs.

The second embodiment of the method according to the invention shown in FIG. 3 essentially includes the method steps 39, 40, 41a, 41b, 42a, 42b, 43 of the first embodiment of the method according to the invention as shown in FIG. 2. The second embodiment of the method according to the invention shown in FIG. 3 has further method steps and sub-steps. Also conceivable is an alternative method sequence to that of FIG. 3, which has only part of the additional method steps and/or sub-steps represented in FIG. 2. Naturally, an alternative method sequence to that of FIG. 3 can also have additional method steps and/or sub-steps.

The optimization of the magnetic resonance sequence is carried out in the exemplary embodiment shown in FIG. 3 based on further pre-sets by a user. Thus, in a further method step 44a, the user specifies, via the input unit 26, an optimization threshold value which at least indirectly defines a slew rate threshold value. Herein, the user specifies, for example, via the input unit 26, a loudness threshold value as the optimizing threshold value for the optimized magnetic resonance sequence. The loudness threshold value gives a maximum loudness, particularly in dB, which should not be exceeded during the recording of magnetic resonance imaging data with the optimized magnetic resonance sequence. Based on a specific relation for the magnetic resonance device 11 between the loudness threshold value and the slew rate threshold value, the sequence optimizing device 30, in particular the acquisition unit 33, can determine the slew rate threshold value from the loudness threshold value.

Furthermore in the case shown, the user specifies, in a further method step 44b, via the input unit 26, a threshold value for a maximum adjustment of at least one imaging parameter of a number of imaging parameters of the magnetic resonance sequence.

The optimization of the magnetic resonance sequence in the further method step 42a, 42b includes, in the case shown, a first sub-step 45 in which the at least one optimizing measure is set such that for the optimization of the magnetic resonance sequence, the at least one imaging parameter is adjusted by the optimizing device 34 within the threshold value set in the further method step 44b. In the present case, the at least one imaging parameter comprises, by way of example, an echo time of the magnetic resonance sequence, wherein the adjustment of the at least one imaging parameter comprises a prolongation of the echo time. The at least one optimizing measure is set such that the at least one imaging parameter is adjusted by the optimizing device 34 such that the multiple optimized slew rates of the optimized magnetic resonance sequence are each smaller than the slew rate threshold value defined in the further method step 44a or are equal to the slew rate threshold value. Furthermore, the at least one optimizing measure is set such that the optimization of the magnetic resonance sequence by the optimizing device 34 is carried out such that a highest optimized slew rate of the multiple optimized slew rates is reduced relative to a highest pre-set slew rate of the multiple pre-set slew rates.

For the optimization of the magnetic resonance sequence, in a further sub-step 46, a number of optimizations are carried out based on different optimizing measures, each involving different adjustments of imaging parameters. The results of the plurality of optimizations can be displayed in a further sub-step 47 on the display unit 25 as a number of optimization suggestions, wherein a selection of at least one optimization suggestion of the plurality of optimization suggestions is carried out by a user via the input unit 26. The optimization of the magnetic resonance sequence in the further method step 42 is then carried out by means of the at least one optimization suggestion selected.

The method steps of the method according to the invention as shown in FIGS. 2 and 3 are carried out by the magnetic resonance apparatus, in particular by the sequence optimizing device 30. For this purpose, the magnetic resonance device 30, in particular the sequence optimizing device 30, has required software and/or computer programs which are stored in a storage unit of the magnetic resonance apparatus 11, in particular the sequence optimizing device 30. The software and/or computer programs is encoded with program code configured to carry out the method according to the invention if the computer program and/or the software in the magnetic resonance device 11, particularly in the sequence optimizing unit 30, is carried out by means of a processor unit of the magnetic resonance device 11, in particular the sequence optimizing unit 30.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for optimizing operating a magnetic resonance (MR) sequence for operating an MR apparatus, the said MR sequence comprising a plurality of pre-set gradient switching sequences with a plurality of pre-set slew rates, said MR apparatus comprising gradient coils, said method comprising:
   providing a computer with an MR sequence comprising a plurality of pre-set gradient switching sequences for said gradient coils, each having at least one pre-set slew rate;
   in said computer, automatically evaluating the respective pre-set slew rates of said pre-set gradient switching sequences;
   in said computer, defining at least one optimizing measure for said MR sequence from said evaluation of said pre-set slew rates;
   in said computer, automatically optimizing the MR sequence according to said at least one optimizing measure defined by said evaluation of said pre-set slew rates, in order to generate an optimized MR sequence comprising a plurality of optimized gradient switching sequences each with at least one optimized slew rate, with said optimized slew rates being respectively optimized according to said defined optimizing measure, in comparison to said pre-set slew rates in the MR sequence provided to the computer, so that pre-set slew rates in a first subset of said pre-set slew rates in the MR sequence provided to the computer are reduced, and pre-set slew rates in a second subset of said plurality of pre-set slew rates in the MR sequence provided to the computer are increased; and
   generating control signals in said computer corresponding to the optimized MR sequence, and operating said MR apparatus with said control signals in order to acquire MR data from a subject, with said gradient coils operated, at respectively different times in said optimized MR sequence, with said reduced slew rate and with said increased slew rate, and reconstructing image data from the MR data, and displaying said image data as an MR image of the subject at a display screen in communication with said computer.

2. A method as claimed in claim 1 comprising, in said computer, setting an optimization threshold value that at least indirectly defines a slew rate threshold value, and defining said at least one optimizing measure to cause said optimized MR sequence to be generated with the plurality of optimized slew rates each being less than or equal to the slew rate threshold value.

3. A method as claimed in claim 2 comprising pre-setting said optimization threshold by pre-setting a loudness threshold for acoustic noise that will be produced by said gradient switching sequences when said MR apparatus is operated according to the optimized MR sequence.

4. A method as claimed in claim 1 comprising defining said at least one optimization measure to cause said optimized MR sequence to be generated with a highest optimized slew rate, among said plurality of optimized slew rates, being reduced with respect to a highest pre-set slew rate among said plurality of pre-set slew rates.

5. A method as claimed in claim 1 wherein said MR sequence comprises a plurality of imaging parameters, and wherein said method comprises defining said at least one optimizing measure to cause said optimized MR sequence to be generated with an adjustment of at least one imaging parameter, among said plurality of imaging parameters.

6. A method as claimed in claim 5 comprising, in said computer, setting an optimization threshold value that at least indirectly defines a slew rate threshold value, and defining said at least one optimizing measure to cause said optimized MR sequence to be generated with the plurality of optimized slew rates each being less than or equal to the slew rate threshold value, and comprising defining said at least one optimizing measure to cause said at least one imaging parameter to be adjusted to make said plurality of optimized slew rates each less than or equal to said slew rate threshold value.

7. A method as claimed in claim 5 wherein said at least one imaging parameter is an echo time of said MR sequence, and comprising adjusting said at least one imaging parameter by prolonging said echo time.

8. A method as claimed in claim 5 wherein said computer comprises an input interface, and comprising entering a threshold value into said computer, via said input interface that defines a maximum adjustment in said computer of said at least one imaging parameter.

9. A method as claimed in claim 5 wherein said computer comprises an input interface and an output interface comprising a display screen, and wherein said method comprises executing a plurality of optimizations of said MR sequence in said computer respectively using different optimizing measures, with each optimizing measure comprising different adjustments of said imaging parameters, and displaying respective results of the plurality of optimizations at said display screen as a plurality of optimization suggestions, and allowing a selection of at least one optimization suggestion, among said plurality of optimization suggestions, via said input interface.

10. A magnetic resonance (MR) apparatus comprising:
    an MR data acquisition scanner comprising gradient coils;
    a processor;
    said processor comprising an input interface that receives an MR sequence that is to be used to operate said MR data acquisition scanner, said MR sequence comprising plurality of pre-set gradient switching sequences for said gradient coils, each having at least one pre-set slew rate;
    said processor being configured to automatically evaluate the pre-set slew rates;
    said processor being configured to define at least one optimizing measure for said MR sequence from said evaluation of said pre-set slew rates;

said processor being configured to automatically optimize the MR sequence according to said at least one optimizing measure defined by said evaluation of said pre-set slew rates, in order to generate an optimized MR sequence comprising a plurality of optimized gradient switching sequences each having at least one optimized slew rate that is optimized according to said defined optimizing measure in comparison to said plurality of pre-set slew rates in the MR sequence provided to the computer, so that pre-set slew rates in a first subset of said pre-set slew rates in the MR sequence provided to the computer are reduced, and pre-set slew rates in a second subset of said plurality of pre-set slew rates in the MR sequence provided to the computer are increased; and said processor being configured to generate control signals corresponding to the optimized MR sequence and to operate said MR apparatus with said control signals in order to acquire MR data from a subject, with said gradient coils operated, at respectively different times in said optimized MR sequence, with said reduced slew rate and with said increased slew rate, and to reconstruct image data from the MR data, and to display said image data as an MR image of the subject at a display screen in communication with said computer.

11. A non-transitory, computer-readable data storage medium encoded with programming instructions, said storage medium being loaded into a control computer of a magnetic resonance (MR) apparatus comprising an MR data acquisition scanner comprising gradient coils, and said programming instructions causing said control computer to optimize an MR sequence for operating said MR apparatus, said MR sequence comprising a plurality of pre-set gradient switching sequences for said gradient coils, each having at least one pre-set slew rate, by causing said control computer to:

receive said MR sequence;

automatically evaluate the pre-set slew rates that are respectively in said gradient switching sequences;

define at least one optimizing measure for said MR sequence from said evaluation of said pre-set slew rates;

automatically optimize the MR sequence according to said at least one optimizing measure defined by said evaluation of said pre-set slew rates, in order to generate an optimized MR sequence comprising a plurality of optimized gradient switching sequences each with at least one optimized slew rate, with said optimized slew rates being optimized according to said defined optimizing measure in comparison to said pre-set slew rates in the MR sequence provided to the computer, so that pre-set slew rates in a first subset of said pre-set slew rates in the MR sequence provided to the computer are reduced, and pre-set slew rates in a second subset of said plurality of pre-set slew rates in the MR sequence provided to the computer are increased; and generate control signals corresponding to the optimized MR sequence, and operate said MR apparatus with said control signals in order to acquire MR data from a subject, with said gradient coils operated, at respectively different times in said optimized MR sequence, with said reduced slew rate and with said increased slew rate, and reconstruct image data from the MR data, and display said image data as an MR image of the subject at a display screen in communication with said computer.

* * * * *